US011888287B2

United States Patent
Thompson et al.

(10) Patent No.: US 11,888,287 B2
(45) Date of Patent: Jan. 30, 2024

(54) SPLIT LIQUID COOLED HEAT EXCHANGER WITH THERMOELECTRIC COOLING CONTROLLED TEMPERATURE

(71) Applicant: BAE SYSTEMS Information and Electronic Systems Integration Inc., Nashua, NH (US)

(72) Inventors: David E. Thompson, Nashua, NH (US); Gerard J. Pelletier, Amherst, NH (US); Glenn Sindledecker, Dracut, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 393 days.

(21) Appl. No.: 17/175,773

(22) Filed: Feb. 15, 2021

(65) Prior Publication Data
US 2022/0263287 A1 Aug. 18, 2022

(51) Int. Cl.
H01S 5/024 (2006.01)
H01S 3/0941 (2006.01)
H01S 3/04 (2006.01)
H01S 3/042 (2006.01)
H01L 23/473 (2006.01)
H01S 5/04 (2006.01)

(52) U.S. Cl.
CPC ........ *H01S 5/02423* (2013.01); *H01L 23/473* (2013.01); *H01S 3/0407* (2013.01); *H01S 3/0941* (2013.01); *H01S 5/02415* (2013.01); *H01S 3/042* (2013.01); *H01S 5/041* (2013.01)

(58) Field of Classification Search
CPC ............ H01S 5/02415; H01S 5/02423; H01S 3/0407; H01S 3/042; H01S 3/0941
See application file for complete search history.

(56) References Cited

U.S. PATENT DOCUMENTS

| 5,801,442 | A | 9/1998 | Hamilton et al. |
| 5,940,420 | A | 8/1999 | Blair et al. |
| 8,746,330 | B2 | 6/2014 | Lyon |
| 2003/0086453 | A1* | 5/2003 | Nolan ................. H01S 5/02423 372/35 |
| 2007/0132470 | A1* | 6/2007 | Kamakura .......... H01S 5/02415 324/750.08 |
| 2013/0250985 | A1* | 9/2013 | Xuan ..................... H01S 3/091 372/35 |
| 2015/0188279 | A1* | 7/2015 | Xuan ................... H01S 3/0815 372/35 |

(Continued)

OTHER PUBLICATIONS

Thermoelectric cooling, https://en.wikipedia.org/wiki/Thermoelectric_cooling, accessed Nov. 17, 2020.

*Primary Examiner* — Michael Carter
(74) *Attorney, Agent, or Firm* — KPIP Law PLLC; Scott J. Asmus; Gary McFaline

(57) ABSTRACT

The system and method for cooling a laser using a split liquid cooled heat exchanger. The temperature of coolant entering the system is applied to a portion of the system most in need of lower temperatures and a second heat exchanger uses the outflow from the first heat exchanger to cool a remaining portion of the system that has a tolerance for higher temperatures. The laser cooling system is compact, e.g., less than 45 cubic inches and can handle thermal loads of about 800 W.

18 Claims, 6 Drawing Sheets

(56) References Cited

U.S. PATENT DOCUMENTS

2019/0044305 A1* 2/2019 Kuriaki ............... H01S 5/06825
2020/0052461 A1* 2/2020 Belley .................. H01S 5/0238
2020/0161825 A1   5/2020 Zona et al.

* cited by examiner

SPLIT LIQUID COOLED HEAT EXCHANGER WITH THERMOELECTRIC COOLING CONTROLLED TEMPERATURE

STATEMENT OF GOVERNMENT INTEREST

This disclosure was made with United States Government support under a classified contract number awarded by a classified agency. The United States Government has certain rights in this invention.

FIELD OF THE DISCLOSURE

The present disclosure relates to laser cooling techniques and more particularly to a split liquid cooled heat exchanger with thermoelectric cooling-controlled temperature.

BACKGROUND OF THE DISCLOSURE

Previous laser cooling designs exist that have been successful at much lower thermal density with a similar packaging density (small form factors), and at higher thermal density, but only with much larger packaging volume. As power requirements increase, often the packaging volume decreases and this poses the challenge of managing system performance over often, large thermal excursions in very tight spaces.

Wherefore it is an object of the present disclosure to overcome the above-mentioned shortcomings and drawbacks associated with the conventional laser cooling techniques.

SUMMARY OF THE DISCLOSURE

One aspect of the present disclosure is a laser cooling system, comprising: a first liquid cooled heat exchanger in fluid connection with a laser cooling system inlet; a pair of heat spreaders for mounting a pair of pump diode arrays in fluid connection with the first liquid cooled heat exchanger; a pair of thermoelectric coolers, each for precise independent thermal control of a pump diode array; a first temperature sensing device mounted on the first liquid cooled heat exchanger to monitor the pair of thermoelectric coolers; a second liquid cooled heat exchanger in fluid connection with the first liquid cooled heat exchanger and with a laser cooling system outlet; the pair of gain medium, comprising crystals and crystal mount heat spreaders, in fluid connection with the second liquid cooled heat exchanger; and a second temperature sensing device mounted on the second liquid cooled heat exchanger to monitor the pair of crystal mount heat spreaders; the first and second liquid cooled heat exchangers being thermally isolated via structure yet sharing a serial fluid path thereby forming a split liquid cooled heat exchanger.

One embodiment of the laser cooling system is wherein the pair of pump diode arrays comprise an average heat per array of >100 W. In certain embodiments, a fluid path within the pump diode arrays is split parallel paths for heat spreading within the first heat exchanger.

Another embodiment of the laser cooling system is wherein the pair of gain medium comprises oscillator and amplifier stages.

Yet another embodiment of the laser cooling system is wherein the split liquid cooled heat exchanger occupies a volume of less than 45 cubic inches. In some cases, a thermal load of the laser cooling system is about 800 W.

Still yet another embodiment of the laser cooling system is wherein a temperature of fluid entering the laser cooling system via the laser cooling system inlet is about 20° C. In certain embodiments, a temperature of fluid entering the second liquid cooled heat exchanger is about 25° C. In some embodiments, a temperature of fluid exiting the laser cooling system via the laser cooling system outlet is less than 30° C.

Another aspect of the present disclosure is a method of cooling a laser system, comprising: providing a compact laser system, comprising: a first liquid cooled heat exchanger in fluid connection with a laser cooling system inlet; a pair of heat spreaders for mounting a pair of pump diode arrays in fluid connection with the first liquid cooled heat exchanger; a pair of thermoelectric coolers, each for precise independent thermal control of a pump array; a first temperature sensing device mounted on the first liquid cooled heat exchanger to monitor the pair of thermoelectric coolers; a second liquid cooled heat exchanger in fluid connection with the first liquid cooled heat exchanger and with a laser cooling system outlet; the pair of gain medium, comprising crystals and crystal mount heat spreaders, in fluid connection with the second liquid cooled heat exchanger; and a second temperature sensing device mounted on the second liquid cooled heat exchanger to monitor the pair of crystal mount heat spreaders; the first and second liquid cooled heat exchangers being thermally isolated via structure yet sharing a serial fluid path thereby forming a split liquid cooled heat exchanger; flowing a coolant into the first liquid cooled heat exchanger via the laser cooling system inlet; cooling a pair of pump diode arrays via a pair of thermoelectric coolers in fluid connection with the first liquid cooled heat exchanger; measuring a temperature of the pair of pump diode arrays; flowing the coolant from the first liquid cooled heat exchanger to the second liquid cooled heat exchanger; cooling a pair of gain medium via a pair of crystal mount heat spreaders in fluid connection with the second liquid cooled heat exchanger; measuring a temperature of the pair of gain medium; and flowing the coolant out of the laser cooling system outlet at a temperature less than 30° C.

One embodiment of the method of cooling a laser system is wherein the pair of pump diode arrays comprise average heat per array of >100 W. In some cases, a fluid path within the pump diode arrays is split parallel paths for heat spreading within the first heat exchanger.

Another embodiment of the method of cooling a laser system is wherein the pair of gain medium comprises oscillator and amplifier stages.

Yet another embodiment of the method of cooling a laser system is wherein the split liquid cooled heat exchanger occupies a volume of less than 45 cubic inches. In some cases, a thermal load of the laser cooling system is about 800 W.

Still yet another embodiment of the method of cooling a laser system is wherein a temperature of fluid entering the laser cooling system via the laser cooling system inlet is about 20° C. In some cases, a temperature of fluid entering the second liquid cooled heat exchanger is about 25° C.

Yet another aspect of the present disclosure is a method of cooling a laser system, comprising: providing a compact laser system, comprising: a first liquid cooled heat exchanger in fluid connection with a laser cooling system inlet; a pair of heat spreaders for mounting a pair of pump diode arrays in fluid connection with the first liquid cooled heat exchanger; a pair of thermoelectric coolers, each for precise independent thermal control of a pump array; a first temperature sensing device mounted on the first liquid cooled heat exchanger to monitor the pair of thermoelectric coolers; a second liquid cooled heat exchanger in fluid connection with the first liquid cooled heat exchanger and with a laser cooling system outlet; the pair of gain medium, comprising crystals and crystal mount heat spreaders, in fluid connection with the second liquid cooled heat exchanger; and a second temperature sensing device mounted on the second liquid cooled heat exchanger to monitor the pair of crystal mount heat spreaders; the first and second liquid cooled heat exchangers being thermally isolated via structure yet sharing a serial fluid path thereby forming a split liquid cooled heat exchanger; flowing a coolant into the first liquid cooled heat exchanger via the laser cooling system inlet, wherein the coolant is about 20° C.; cooling a pair of pump diode arrays via a pair of thermoelectric coolers in fluid connection with the first liquid cooled heat exchanger; measuring a temperature of the pair of pump diode arrays; flowing the coolant from the first liquid cooled heat exchanger to the second liquid cooled heat exchanger, wherein the coolant is about 25° C.; cooling a pair of gain medium via a pair of crystal mount heat spreaders in fluid connection with the second liquid cooled heat exchanger; measuring a temperature of the pair of gain medium; and flowing the coolant out of the laser cooling system outlet at a temperature less than 30° C.

One embodiment of the method of cooling a laser system is wherein the split liquid cooled heat exchanger occupies a volume of less than 45 cubic inches.

Another embodiment of the method of cooling a laser system is wherein a thermal load of the laser cooling system is about 800 W.

These aspects of the disclosure are not meant to be exclusive and other features, aspects, and advantages of the present disclosure will be readily apparent to those of ordinary skill in the art when read in conjunction with the following description, appended claims, and accompanying drawings.

BRIEF DESCRIPTION OF THE DRAWINGS

The foregoing and other objects, features, and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION OF THE DISCLOSURE

Figure 1:
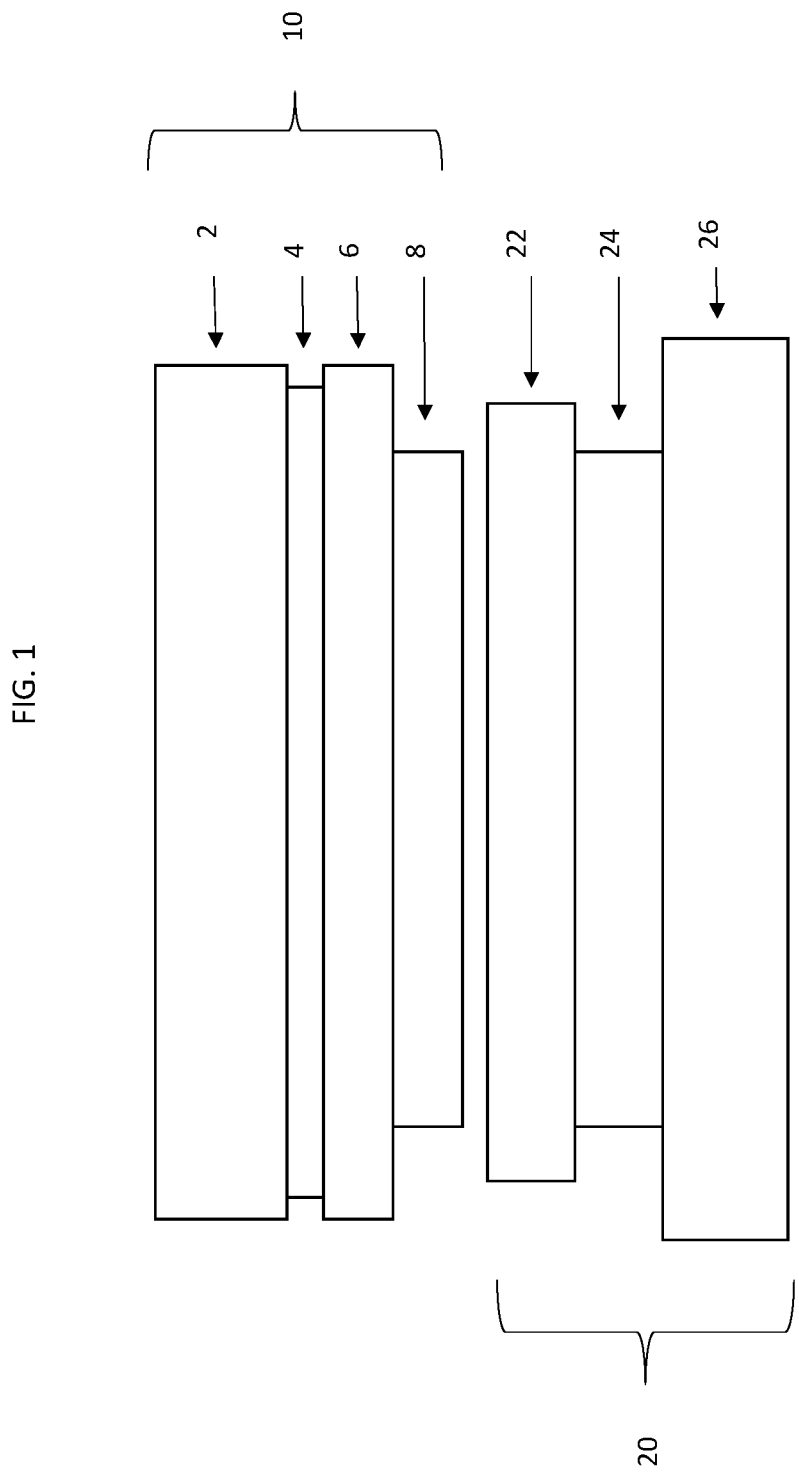
FIG. 1 is a diagrammatic view of a split liquid cooled heat exchanger with thermoelectric cooling-controlled temperature and a laser gain media assembly according one embodiment of the present disclosure.

One embodiment of a split liquid cooled heat exchanger with thermoelectric cooling-controlled temperature of the present disclosure has one path that uses liquid cooling only and another path that uses a combination of liquid cooling and thermoelectric cooling (TEC) temperature control. In certain embodiments, the two coolant paths are serial, but the heat exchangers are isolated from one another structurally, and thermally.

The present system provides for a high thermal density to be managed through split heat exchanger paths. The present system can accommodate higher heat loads in a compact form factor, as compared to traditional systems, and still maintain optical stability. The approach of the present disclosure is useful for applications where liquid cooling is used in compact form factors with high thermal densities, and precise temperature control of components is required.

Previous systems were much lower power than this system, <10×. Optical stability is measured in this instance as output power and pointing accuracy as a function of thermal gradients and deformation. By spreading heat, thermal gradients are managed and deformation, as a result of thermal gradients, is reduced. Reducing the deformation internal to the system mitigates thermal detuning of optical alignment that often results in output power loss. Additionally, decoupling thermal loads that are close to each other, by system design, further reduces thermal gradients while maintaining high power densities in a compact volume.

One embodiment of a split liquid cooled heat exchanger with thermoelectric cooling-controlled temperature of the present disclosure has solid-state light sources that direct pump a gain medium, and the thermal loads from these sources and the gain medium (e.g., 800 W) are all within <45 cubic inches of volume. This is an extremely high thermal density application. By splitting the cooling paths as disclosed herein, the most important components get coolant first (i.e., the sources) and then heat is dissipated before reaching the next component (i.e., gain medium). Embodiments of the system configuration provide more uniform cooling and temperature regulation of both the pump diodes (sources) and the laser gain media. Embodiments provide higher electrical-optical efficiency in a low SWaP configuration, which is critical for advanced tactical platforms where both power and cooling capacity are limited.

An implementation of the present disclosure uses the coldest liquid (as it enters the system) to cool the components needing the tightest thermal control, and the components not needing as tight a thermal control use the fluid that exits a first heat exchanger. The heat exchangers are compact, and scalable for thermal loads, and are thermally isolated via structure, yet share a serial fluid path. Gain medium is not affected by fluid temperature rise due to the serial path. The fluid path within the pump diode arrays is a split parallel path for heat spreading within the heat exchanger.

Fluid input to the laser coiling cooling system is about 20° C. and fluid input into the second liquid cooled heat exchanger is approximately 25° C. The crystals during operation have to stay below 60° C. So, 60° C. is at the crystal center. The fluid temp upon exiting the laser cooling system is no more than 30° C. In some cases, 85° C. refers to a maximum temp of other downstream system components. There are always thermal resistances from heat load source (diode, crystals, parts on boards) that result in temperatures rising between the load and ultimately the transfer fluid. Each material, thickness, distance, all stack up, and add to the temperature delta. For instance, if the pump diodes are to be held at 25° C., the diode body has a temp rise to its base. Then, through the thickness of the interface material, the spreader, the next thermal interface, all have temp rises. Then the heat passes through the TEC. Finally, the interface material, the heat exchanger thickness, the fin stock, and area to the fluid. In one embodiment, a margin of exit fluid is about 25° C. and holding the diodes to a 25° C. or 30° C. temperature rise. The stack up of temp rise through all the interfaces needs to be less than the 30° C.

Certain embodiments of the present disclosure apply to both liquid and air-cooled systems as well. In some cases, an enhanced cooling capacity is achieved using heat pipes/heat spreaders enabled by advanced additive manufacturing methods. In certain embodiments, the system is not limited to only two channels. In one embodiment, this approach can apply to other heat loads that are more remotely mounted and not in direct contact with the heat exchanger, or it could be a combination of thermal management schemes where heat spreaders are integral to the heat exchanger to assist in directing the heat towards an air or liquid coolant path.

Referring to FIG. 1, a diagrammatic view of a split liquid cooled heat exchanger with thermoelectric cooling-controlled temperature and a laser gain media assembly according one embodiment of the present disclosure is shown. More specifically, the first path of the system 10 comprises a single compact pump liquid cooled heat exchanger 2 having two sets arrays of high average power pump diodes 8 (e.g., >100 W of heat per array), two sets of diode mounted heat spreaders 6, and two sets of thermoelectric coolers (TEC) 4 for precise independent thermal control of each pump diode array 8. It is understood that thermoelectric coolers operate by the Peltier effect. Typically, a TEC has two sides, and when electric current flows through the TEC, it brings heat from one side to the other side, so that one of the sides gets cooler while the other side gets hotter. The "hotter" side is typically attached to a heat sink so that it remains at ambient temperature, while the "cooler" side goes below ambient temperature. A significant benefit of TEC systems is that they have no moving parts. This lack of mechanical wear and reduced instances of failure due to fatigue and fracture from mechanical vibration and stress increases the lifespan of these systems and lowers the maintenance requirements.

Still referring to FIG. 1, in certain embodiments each of a pair of crystals 22 (gain medium) and crystal mount heat spreaders or gain mount 24 attach to a separate liquid cooled heat exchanger 26 for the second path 20 of the split liquid cooled heat exchanger of the present disclosure. Thermal performance is passively controlled/matched to each other within the gain medium assembly. Splitting the heat exchangers further spreads the thermal load and allows for managing coolant temperatures more efficiently. In some cases, this provides an optically stable scalable pump laser architecture, where additional pump diodes may be added, or additional amplifier stages added. In certain embodiments, the pair of non-liner crystal gain medium 22 operate as an oscillator and an amplifier, respectively.

Figure 2:
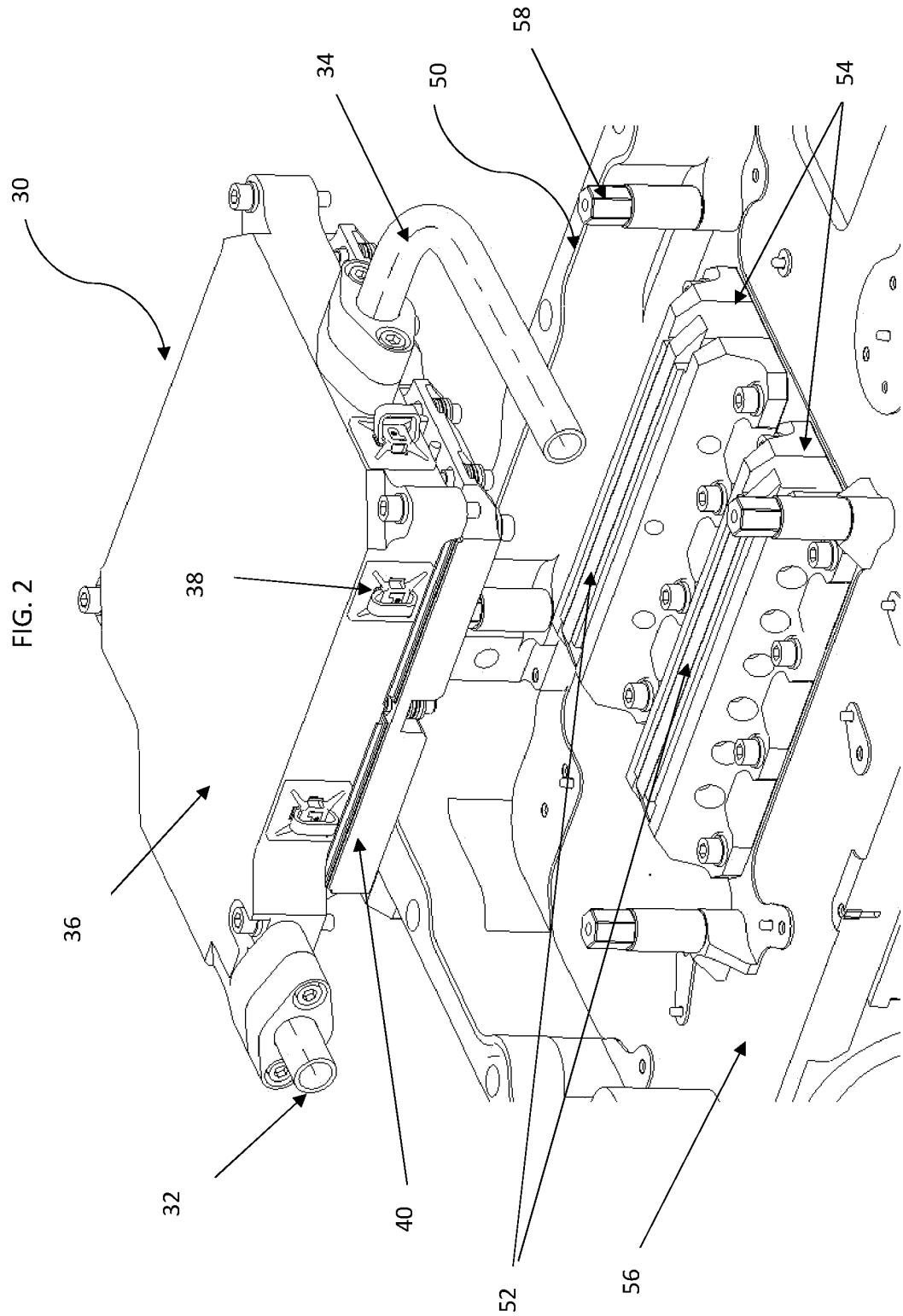
FIG. 2 is a perspective view of a split liquid cooled heat exchanger with thermoelectric cooling-controlled temperature and a liquid cooled laser gain media assembly prior to assembly according one embodiment of the present disclosure.

Referring to FIG. 2, a perspective view of a split liquid cooled heat exchanger with thermoelectric cooling-controlled temperature and a laser gain media assembly is shown prior to assembly according one embodiment of the present disclosure. More specifically, a first path of the split liquid cooled heat exchanger with thermoelectric cooling-controlled temperature 30 is shown prior to assembling with the laser gain media assembly 50, the second path of the split liquid cooled heat exchanger. In certain embodiments, the laser gain media assembly 50 comprises a pair of non-linear crystals 52 (gain medium) and crystal mounted heat spreaders 54 attached to a separate liquid cooled heat exchanger 56. The laser pump assembly mounts onto the secondary heat exchanger via the four posts 58 shown. These set the pump laser to gain medium spacing and also provide a thermal break for the two heat exchangers.

In one embodiment of the split liquid cooled heat exchanger with thermoelectric cooling-controlled temperature, a single input pipe 32 and a single output pipe 34 for circulating liquid through the first path of the system is used. Here, 34 goes to the second heat exchanger, where 36 is the first heat exchanger and 56 is the second heat exchanger. Cable management for the pump laser assembly 38 are shown. The heat spreader that the pump laser mounts to is 40. In certain embodiments, the single inlet splits parallel and then meets again to exit via a single outlet so that the pair of gain medium are efficiently cooled. It cannot be seen in the images, but the metal that the gain medium crystals mounts attach to is the secondary heat exchanger in this embodiment. The pipe exiting the top heat exchanger has a similar input elsewhere (not shown) in the secondary heat exchanger.

In certain embodiments of the system, the power input for the sources is about 300 W (e.g., via two diodes using four TECs) such that 150 W is fed into each crystal gain medium. This embodiment is about 10× the power of conventional systems. This power increase in a very compact space (e.g., 20 cubic inches) necessitates a different approach than typical systems because the same amount of heat is housed in such a small space. Not controlling heat can lead to loss of thermal control, loss of performance, damage to components, and system failure. In one embodiment, the system is used in a high average power laser.

One embodiment of the system provides that a first component in the system (e.g., sources) receives cooled fluid and subsequent components (e.g., the gain medium) receives fluid after cooling the sources. The system also provides for ease of assembly and ease of service. Components are designed where assembly and disassembly are considered as well as subcomponent testing. In one embodiment, the pump array assembly can be removed and reinstalled via pinned locations to ensure accurate position of components with respect to each other. Individual subcomponents are also easily replaced at their respective assemblies.

Figure 3:
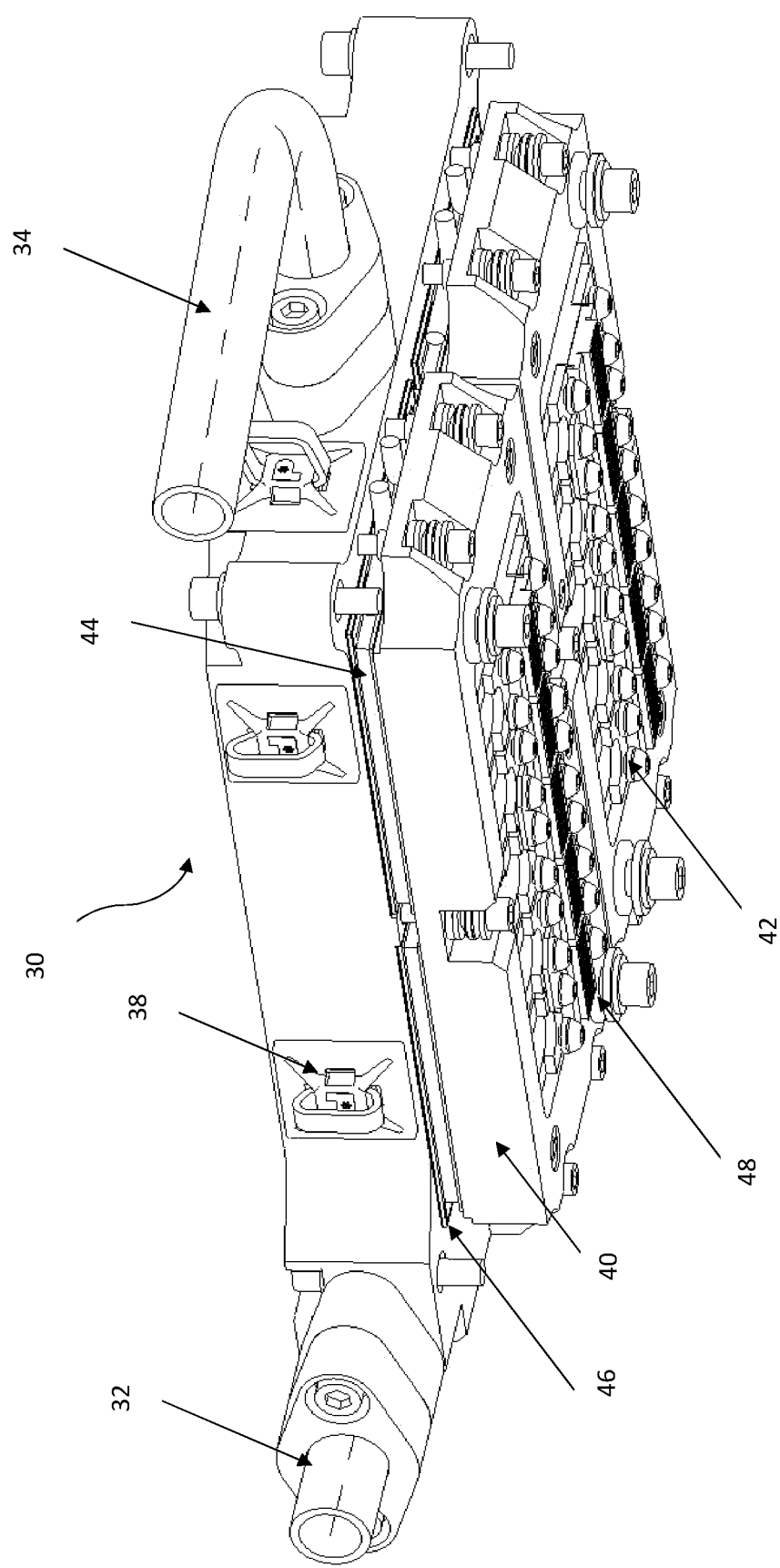
FIG. 3 is a perspective view of a first path of a split liquid cooled heat exchanger with thermoelectric cooling-controlled temperature according one embodiment of the present disclosure.

Referring to FIG. 3, a perspective view of a first path of a split liquid cooled heat exchanger with thermoelectric cooling-controlled temperature according one embodiment of the present disclosure is shown. More specifically, a single compact pump liquid cooled heat exchanger 30 is shown. One embodiment of the single compact pump liquid cooled heat exchanger 30 has two sets of high average power pump diodes 48, two sets of diode mounted heat spreaders 40, and two sets of thermoelectric coolers (TEC) 44 (for a total of four TECs) for precise independent thermal control of each pump array. A thermal interface material 46 may also be used. A bus bar 42 provides an efficient and repeatable way to consistently distribute power to a wide array of system loads. In certain embodiments, each heat spreader has its own thermal sensor, while the first liquid-cooled heat exchanger has a single thermal sensor for temperature monitoring of each of the TEC hot sides. In certain embodiments, another temperature sensing device is mounted on the second liquid cooled heat exchanger to monitor the pair of crystal mount heat spreaders.

Figure 4:
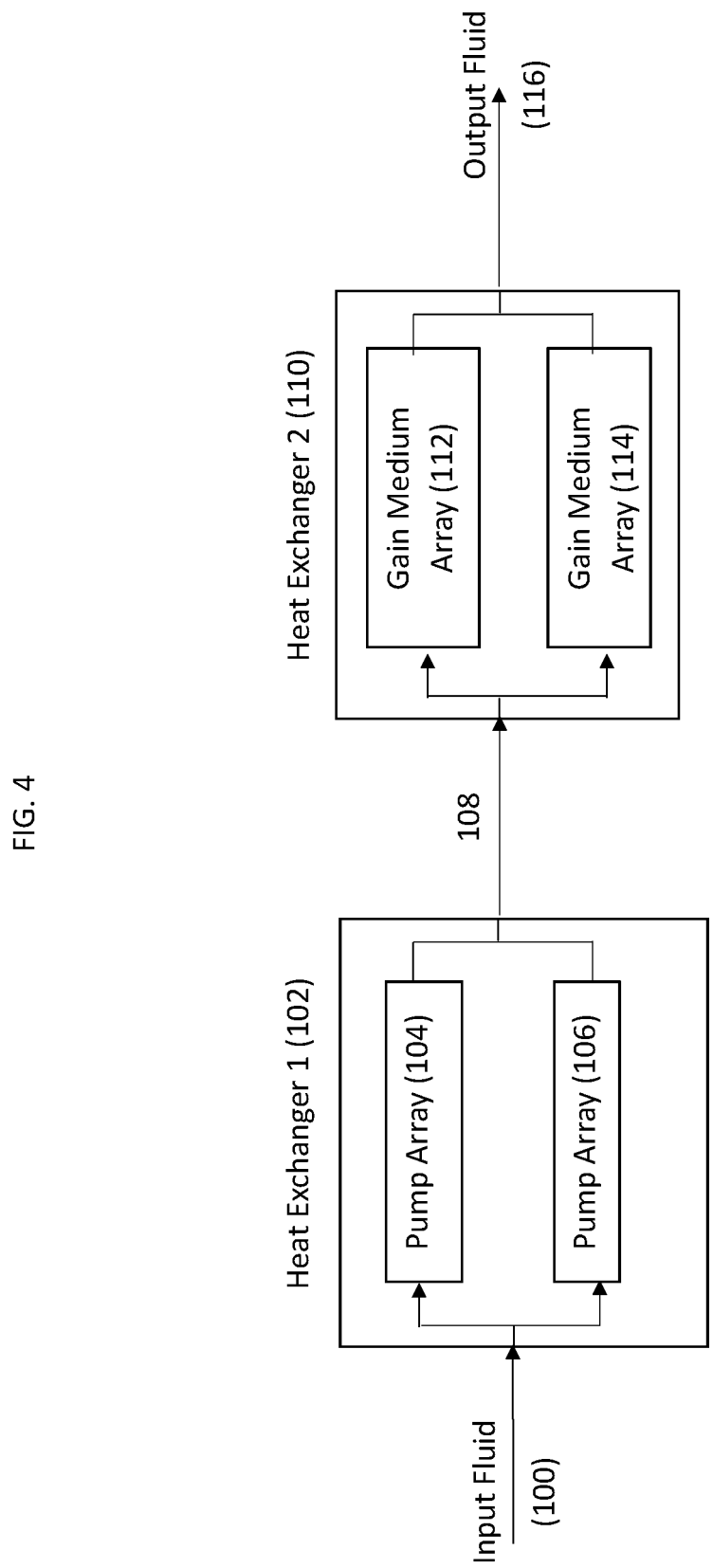
FIG. 4 is a diagrammatic view of a split liquid cooled heat exchanger system with thermoelectric cooling-controlled temperature and a laser gain media assembly according one embodiment of the present disclosure.

Referring to FIG. 4, a diagrammatic view of a split liquid cooled heat exchanger system with thermoelectric cooling-controlled temperature and a laser gain media assembly according one embodiment of the present disclosure is shown. More specifically, input fluid 100 enters the first heat exchanger 102 to cool the components in most need for thermal regulation (the pump arrays 104 and 106). The fluid then passes out of the first heat exchanger 102 and into the second heat exchanger 110 via 108. The fluid then cools the pair of gain medium (112 and 114) and exists the system as output fluid 116. The fluid output from the secondary heat exchanger is then used to cool electronics and other components in the greater system that can handle higher operating temperatures, before then exiting the system. Fluid then flows to a chiller (ECS) to complete the chain.

Figure 5:
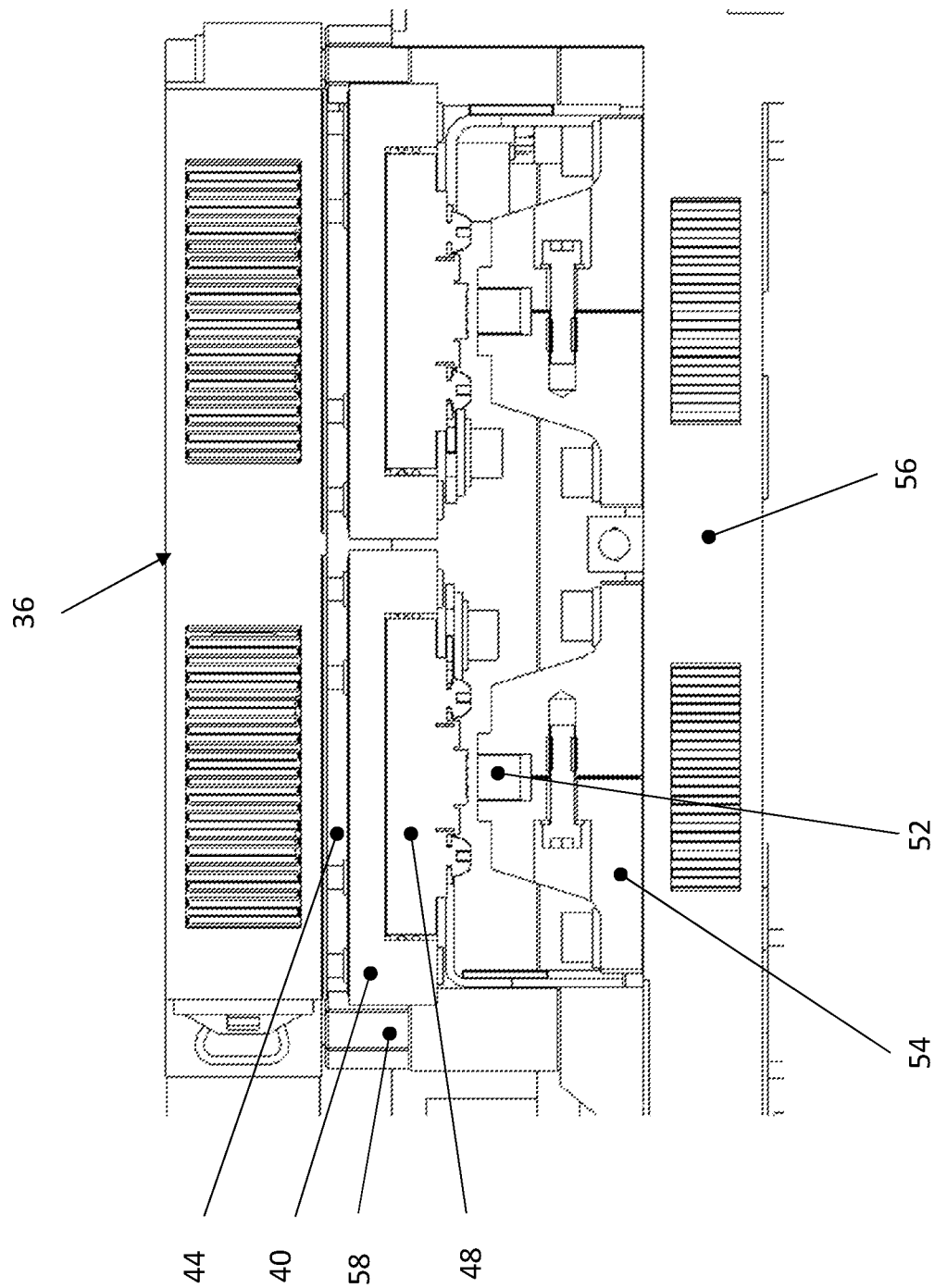
FIG. 5 is a cross-sectional view of a split liquid cooled heat exchanger with thermoelectric cooling-controlled temperature and a liquid cooled laser gain media assembly according one embodiment of the present disclosure.

Referring to FIG. 5, a cross-sectional view of a split liquid cooled heat exchanger with thermoelectric cooling-controlled temperature and a liquid cooled laser gain media assembly according one embodiment of the present disclosure is shown. More specifically, this view cuts through the split liquid cooled heat exchanger to show the two separate paths in each heat exchanger (36 and 56) for the flow under each set of pump array (48) and gain medium (52), respectively. The heat exchangers 36 and 56 being shown with other parts per pump array or per gain medium. For example, the heat spreaders (40 and 54), TECs 44, and posts 58. If another amplifier stage were to be added, it would add an additional channel to the heat exchangers and add another pump array assembly and another gain medium assembly.

Figure 6:
FIG. 6 is a flowchart of one embodiment of a method of cooling a laser assembly using a split liquid cooled heat exchanger with thermoelectric cooling-controlled temperature.

Referring to FIG. 6, a flowchart of one embodiment of a method of cooling a laser assembly using a split liquid cooled heat exchanger with thermoelectric cooling-controlled temperature is shown. More specifically, coolant is flowed into a first liquid cooled heat exchanger via a laser cooling system inlet 200, and a pair of pump diode arrays are cooled via a pair of heat spreaders in fluid connection with the first liquid cooled heat exchanger 202. The temperature of the pair of pump diode arrays is measured 204. The coolant is then flowed from the first liquid cooled heat exchanger to the second liquid cooled heat exchanger 206. A pair of gain medium is cooled via a pair of thermoelectric coolers in fluid connection with the second liquid cooled heat exchanger 208. A temperature of the pair of gain medium is measured 210, such that the coolant flowed out of the laser cooling system outlet is at a temperature less than 30° C.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed:

1. A laser cooling system, comprising:
   a first liquid cooled heat exchanger in fluid connection with a first liquid cooled heat exchanger inlet and a first liquid cooled heat exchanger outlet with liquid flowing from the first liquid cooled heat exchanger inlet through the first liquid cooled heat exchanger to the first liquid cooled heat exchanger outlet;
   a pair of heat spreaders for mounting a pair of pump diode arrays, the heat spreaders coupled to the first liquid cooled heat exchanger for thermal exchange;
   a pair of thermoelectric coolers, each of the thermoelectric coolers providing independent thermal control of one of the pump diode arrays;
   a first temperature sensing device mounted on the first liquid cooled heat exchanger to monitor the pair of thermoelectric coolers;
   a second liquid cooled heat exchanger in fluid connection with the first liquid cooled heat exchanger by coupling the first liquid cooled heat exchanger outlet to a second heat exchanger inlet and with a second liquid cooled heat exchanger outlet with liquid flowing from the second liquid cooled heat exchanger inlet through the second liquid cooled heat exchanger to the second liquid cooled heat exchanger outlet;
   a pair of gain medium, comprising crystals and a pair of crystal mount heat spreaders, the gain medium coupled to the second liquid cooled heat exchanger; and
   a second temperature sensing device mounted on the second liquid cooled heat exchanger to monitor the pair of crystal mount heat spreaders;
   the first and second liquid cooled heat exchangers being thermally isolated via structure yet sharing a serial fluid path thereby forming a split liquid cooled heat exchanger.

2. The laser cooling system according to claim 1, wherein the pair of pump diode arrays comprise an average heat per array of >100 W.

3. The laser cooling system according to claim 1, wherein the pair of gain medium comprises oscillator and amplifier stages.

4. The laser cooling system according to claim 1, wherein the split liquid cooled heat exchanger occupies a volume of less than 45 cubic inches.

5. The laser cooling system according to claim 1, wherein a thermal load of the laser cooling system is about 800 W.

6. The laser cooling system according to claim 1, wherein a temperature of fluid entering the first liquid cooled heat exchanger is about 20° C.

7. The laser cooling system according to claim 1, wherein a temperature of fluid entering the second liquid cooled heat exchanger is about 25° C.

8. The laser cooling system according to claim 1, wherein a temperature of fluid exiting the laser cooling system via the second liquid cooled heat exchanger outlet is less than 30° C.

9. A method of cooling a laser system, comprising:
providing a compact laser system, comprising:
  a first liquid cooled heat exchanger in fluid connection with a first liquid cooled heat exchanger inlet and a first liquid cooled heat exchanger outlet with liquid flowing from the first liquid cooled heat exchanger inlet through the first liquid cooled heat exchanger to the first liquid cooled heat exchanger outlet;
  a pair of heat spreaders for mounting a pair of pump diode arrays coupled to the first liquid cooled heat exchanger for heat exchange;
  a pair of thermoelectric coolers, each for independent thermal control of one of the pump diode arrays;
  a first temperature sensing device mounted on the first liquid cooled heat exchanger to monitor the pair of thermoelectric coolers;
  a second liquid cooled heat exchanger in fluid connection with the first liquid cooled heat exchanger by coupling the first liquid cooled heat exchanger outlet to a second heat exchanger inlet and with a second liquid cooled heat exchanger outlet with liquid flowing from the second liquid cooled heat exchanger inlet through the second liquid cooled heat exchanger to the second liquid cooled heat exchanger outlet;
  a pair of gain medium, comprising crystals and a pair of crystal mount heat spreaders, coupled to the second liquid cooled heat exchanger for heat exchange; and
  a second temperature sensing device mounted on the second liquid cooled heat exchanger to monitor the pair of crystal mount heat spreaders;
  the first and second liquid cooled heat exchangers being thermally isolated via structure yet sharing a serial fluid path thereby forming a split liquid cooled heat exchanger;
flowing a coolant into the first liquid cooled heat exchanger via a first liquid cooled heat exchanger inlet;
cooling the pair of pump diode arrays via the pair of thermoelectric coolers coupled to the first liquid cooled heat exchanger;
measuring a temperature of the pair of pump diode arrays;
flowing the coolant from the first liquid cooled heat exchanger to the second liquid cooled heat exchanger;
cooling the pair of gain medium via the pair of crystal mount heat spreaders coupled to the second liquid cooled heat exchanger;
measuring a temperature of the pair of gain medium; and
flowing the coolant out of the second liquid cooled heat exchanger at a temperature less than 30° C.

10. The method of cooling a laser system according to claim 9, wherein the pair of pump diode arrays comprise average heat per array of >100 W.

11. The method of cooling a laser system according to claim 9, wherein the pair of gain medium comprises oscillator and amplifier stages.

12. The method of cooling a laser system according to claim 9, wherein the split liquid cooled heat exchanger occupies a volume of less than 45 cubic inches.

13. The method of cooling a laser system according to claim 9, wherein a thermal load of the laser cooling system is about 800 W.

14. The method of cooling a laser system according to claim 9, wherein a temperature of fluid entering the first liquid cooled heat exchanger is about 20° C.

15. The method of cooling a laser system according to claim 9, wherein a temperature of fluid entering the second liquid cooled heat exchanger is about 25° C.

16. A method of cooling a laser system, comprising:
providing a compact laser system, comprising:
  a first liquid cooled heat exchanger in fluid connection with a laser cooling system inlet;
  a pair of heat spreaders for mounting a pair of pump diode arrays coupled to the first liquid cooled heat exchanger;
  a pair of thermoelectric coolers, each for precise independent thermal control of the pump diode arrays,
  a first temperature sensing device mounted on the first liquid cooled heat exchanger to monitor the pair of thermoelectric coolers;
  a second liquid cooled heat exchanger in fluid connection with the first liquid cooled heat exchanger;
  a pair of gain medium, comprising crystals and a pair of crystal mount heat spreaders, coupled to the second liquid cooled heat exchanger; and
  a second temperature sensing device mounted on the second liquid cooled heat exchanger to monitor the pair of crystal mount heat spreaders;
  the first and second liquid cooled heat exchangers being thermally isolated via structure yet sharing a serial fluid path thereby forming a split liquid cooled heat exchanger;
flowing a coolant into the first liquid cooled heat exchanger via the laser cooling system inlet, wherein the coolant is about 20° C.;
cooling the pair of pump diode arrays via the pair of thermoelectric coolers in fluid connection with the first liquid cooled heat exchanger, wherein each of the pump diode arrays is cooled by each of the thermoelectric coolers;
measuring a temperature of the pair of pump diode arrays;
flowing the coolant from the first liquid cooled heat exchanger to the second liquid cooled heat exchanger, wherein the coolant is about 25° C.;
cooling the pair of gain medium via the pair of crystal mount heat spreaders in fluid connection with the second liquid cooled heat exchanger;
measuring a temperature of the pair of gain medium; and
flowing the coolant out of the second liquid cooled heat exchanger at a temperature less than 30° C.

17. The method of cooling a laser system according to claim 16, wherein the split liquid cooled heat exchanger occupies a volume of less than 45 cubic inches.

18. The method of cooling a laser system according to claim 16, wherein a thermal load of the laser cooling system is about 800 W.

\* \* \* \* \*